(12) United States Patent
Bazes (10) Patent No.: US 8,593,193 B1
(45) Date of Patent: Nov. 26, 2013

(54) COMPLEMENTARY SEMI-DYNAMIC D-TYPE FLIP-FLOP

(75) Inventor: Mel Bazes, Haifa (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 19 days.

(21) Appl. No.: 13/216,863

(22) Filed: Aug. 24, 2011

Related U.S. Application Data (60) Provisional application No. 61/382,760, filed on Sep. 14, 2010, provisional application No. 61/384,038, filed on Sep. 17, 2010.

(51) Int. Cl.
*H03K 3/289* (2006.01)

(52) U.S. Cl.
USPC ........................................................ 327/202

(58) Field of Classification Search
USPC ......... 327/199–203, 207, 210–212, 214, 215, 327/218, 219
See application file for complete search history.

(56) References Cited

U.S. PATENT DOCUMENTS

| | | | |
|---|---|---|---|
| 5,881,002 A | 3/1999 | Hamakawa | |
| 5,886,553 A | 3/1999 | Matsui | |
| 5,917,355 A | 6/1999 | Klass | |
| 6,222,404 B1 * | 4/2001 | Mehta et al. | 327/200 |
| 6,404,260 B1 | 6/2002 | Cruz-Albrecht | |
| 6,674,666 B2 | 1/2004 | Maone et al. | |
| 7,218,160 B2 | 5/2007 | Wada et al. | |
| 7,403,446 B1 | 7/2008 | Parameswaran et al. | |
| 7,688,640 B2 | 3/2010 | Kang | |
| 7,719,527 B2 | 5/2010 | Lu | |
| 7,994,823 B2 | 8/2011 | Lee et al. | |
| 2003/0226077 A1 * | 12/2003 | Zyuban et al. | 714/726 |
| 2005/0189977 A1 * | 9/2005 | Chen | 327/218 |

OTHER PUBLICATIONS

U.S. Appl. No. 12/963,420, filed Dec. 8, 2010, Holzman, Uri.
Klass, Fabian, "Semi-Dynamic and Dynamic Flip-Flops with Embedded Logic", IEEE, 1998 Symposium on VLSI Circuits Digest of Technical Papers, Jun. 1998, pp. 108-109.

* cited by examiner

*Primary Examiner* — Lincoln Donovan
*Assistant Examiner* — Sibin Chen (57) ABSTRACT

Some of the embodiments of the present disclosure provide a D type flip-flop, comprising a first sampling module configured to sample an input signal while the input signal is at a low logical value; a second sampling module configured to sample the input signal while the input signal is at a high logical value; and a latch configured to logically generate an output signal responsively to the sampling of the input signal by the first sampling module and by the second sampling module. Other embodiments are also described and claimed.

25 Claims, 5 Drawing Sheets

Truth table 300 for the latch 10c

| First Sampling signal 20a | Second Sampling signal 20b | Output Qn | Comments |
|---|---|---|---|
| 0 | 1 | Q(n-1) (Latches or preserves previous state) | Corresponds to when the clock A is low in the clock cycles 1 and 2 of clock A, first and second sampling signals get pre-charged |
| 0 | 0 | 1 | Corresponds to a high level of input D during the rising edge of the clock cycle 1 of clock A |
| 1 | 1 | 0 | Corresponds to a low level of input D during the rising edge of the clock cycle 2 of clock A |
| 1 | 0 | Undefined | As illustrated in Fig. 2, this condition cannot arise |

← First row
← Second row
← Third row
← Fourth row

COMPLEMENTARY SEMI-DYNAMIC D-TYPE FLIP-FLOP

CROSS REFERENCE TO RELATED APPLICATIONS

The present application claims priority to U.S. Patent Application No. 61/382,760, filed on Sep. 14, 2010, and to U.S. Patent Application No. 61/384,038, filed on Sep. 17, 2010, the entire specifications of which are hereby incorporated by reference in their entireties for all purposes, except for those sections, if any, that are inconsistent with this specification.

TECHNICAL FIELD

Embodiments of the present disclosure relate to flip-flops, and more specifically, to D type flip-flops.

BACKGROUND

Unless otherwise indicated herein, the approaches described in this section are not prior art to the claims in the present disclosure and are not admitted to be prior art by inclusion in this section.

Flip-flops are widely used in modern day electronic circuits. In a conventional semi-dynamic D type flip-flop, a sampling window of a relatively short duration opens upon a transition of a clock signal from low to high, and the flip-flop has to complete sampling a high value of an input signal before the sampling window closes. A race condition usually exists between a circuitry that samples the input signal and another circuitry that closes the sampling window. Furthermore, as circuit components shrink in size with the advancement of technology, variability between various similar circuit components is increasing. This increased variability in the conventional semi-dynamic D type flip-flop increases a probability that the inherent race condition will cause the input signal to be sampled incorrectly, thereby causing a malfunction in the flip-flop.

SUMMARY

In various embodiments, the present disclosure provides a D type flip-flop, comprising a first sampling module configured to sample an input signal while the input signal is at a low logical value; a second sampling module configured to sample the input signal while the input signal is at a high logical value; and a latch configured to logically generate an output signal responsively to the sampling of the input signal by the first sampling module and by the second sampling module.

In an embodiment, there is also provided a method comprising sampling, using a first sampling module, an input signal while the input signal is at a low logical value; sampling, using a second sampling module, the input signal while the input signal is at a high logical value; and logically generating, using a latch, an output signal responsively to the first sampling signal and the second sampling signal.

In an embodiment, there is also provided a flip-flop latch comprising a latch configured to receive a first input signal and a second input signal, and logically generate an output signal; switch the output signal when the first and second input signals have substantially identical logical values; preserve a previous state of the output signal when the first input signal has a low logical value and the second input signal has a high logical value; and have an undefined state of the output signal when the first sampling signal has a high logical value and the second sampling signal has a low logical value.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the present disclosure. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

DETAILED DESCRIPTION

Figure 1:
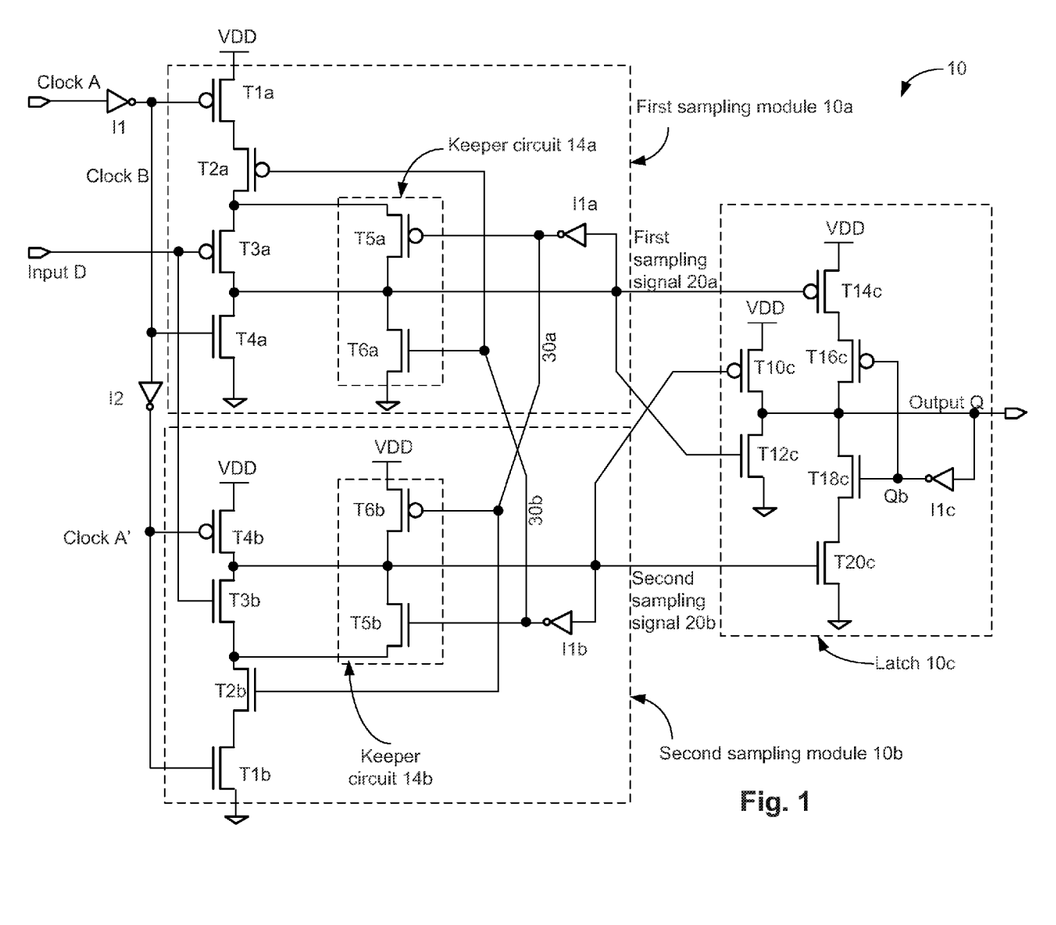
FIG. 1 schematically illustrates a flip-flop, in accordance with an embodiment of the present disclosure.

FIG. 1 schematically illustrates a flip-flop 10, in accordance with an embodiment of the present disclosure. In an embodiment, the flip-flop 10 includes a first sampling module 10a, a second sampling module 10b, and a latch 10c, as illustrated by respective dotted lines in FIG. 1. In various embodiments, the flip-flop 10 receives an input signal D (also referred to herein as input D) and a clock signal A (also referred to herein as clock A), and logically generates an output signal Q (also referred to herein as output Q).

In an embodiment and as will be discussed in more detail herein later, the first sampling module 10a is configured to sample input D while input D is at a low logical value, the second sampling module 10b is configured to sample input D while input D is at a high logical value, and the latch 10c is configured to logically generate output Q responsively to the sampling of input D by the first sampling module 10a and by the second sampling module 10b. As will be discussed in more detail herein later, an operation of the first sampling module 10a and an operation of the second sampling module 10b are complementary to each other (e.g., instead of competing with each other), thereby avoiding any race condition in the flip-flop 10 of FIG. 1.

Referring again to FIG. 1, the flip-flop 10 also includes an inverter I1 configured to receive the clock A and generate a clock signal B (also referred to herein as clock B), and another inverter I2 configured to receive the clock B and generate a clock signal A' (also referred to herein as clock A'). Because of the inversion of clock A by inverters I1 and I2, a delay is present between the signals clock A and clock A' due to the latencies of the inverters I1 and I2.

The first sampling module 10a receives the input D and clock B, and generates a first sampling signal 20a. The second sampling module 10b receives the input D and clock A', and generates a second sampling signal 20b. In an embodiment, the first sampling module 10a is configured to (i) sample the input D while the input D is at a low logical value during a rising edge of clock A, and (ii) generate the first sampling signal 20a corresponding to the input D being sampled by the first sampling module 10a, as will be discussed in more detail herein later. Also, the second sampling module 10b is configured to (i) sample the input D while the input D is at a high logical value during a rising edge of clock A, and (ii) generate the second sampling signal 20b corresponding to the input D being sampled by the second sampling module 10b. Also, the latch 10c is configured to logically generate the output Q responsively to the first sampling signal 20a and the second sampling signal 20b, as will be discussed in more detail herein later. Also, in an embodiment, the first sampling module 10a and the second sampling module 10b are complementary to each other, as will be discussed in detail herein later.

In an embodiment, the first sampling module 10a includes transistors T1a, T2a, T3a and T4a that are connected in series. The transistor T1a is, for example, a P type transistor (e.g., a P type metal-oxide semiconductor field-effect transistor (MOSFET)), with a first terminal configured to receive a supply voltage $V_{DD}$, a second terminal coupled to a first terminal of the transistor T2a, and a control terminal (e.g., a gate terminal) configured to receive the clock B. The transistor T2a is, for example, a P type transistor, with the first terminal coupled to the second terminal of the transistor T1a, a second terminal coupled to a first terminal of the transistor T3a, and a control terminal configured to receive a feedback signal 30b that is generated by the second sampling module 10b. The transistor T3a is, for example, a P type transistor, with the first terminal coupled to the second terminal of the transistor T2a, a second terminal coupled to a first terminal of the transistor T4a, and a control terminal configured to receive the input D. The transistor T4a is, for example, an N type transistor (e.g., an N type MOSFET), with the first terminal coupled to the second terminal of the transistor T3a, a second terminal coupled to a ground terminal, and a control terminal configured to receive the clock B. A node between the second terminal of the transistor T3a and the first terminal of the transistor T4a outputs the first sampling signal 20a, as illustrated in FIG. 1.

The first sampling module 10a also includes a keeper circuit 14a comprising transistors T5a and T6a that are coupled in series. The transistor T5a is coupled between the first terminal of the transistor T3a and the second terminal of the transistor T3a (i.e., coupled parallel to the transistor T3a), and is controlled by an output of an inverter I1a (discussed herein later) of the first sampling module 10a. The transistor T6a is coupled between the second terminal of the transistor T5a and the ground terminal, and is controlled by the feedback signal 30b. The first sampling module 10a also includes the inverter I1a, which receives the first sampling signal 20a and inverts the first sampling signal 20a to generate a feedback signal 30a.

In an embodiment, the second sampling module 10b includes transistors T1b, T2b, T3b and T4b that are connected in series. The transistor T1b is, for example, an N type MOSFET, with a first terminal coupled to a ground terminal, a second terminal coupled to a first terminal of the transistor T2b, and a control terminal configured to receive the clock A'. The transistor T2b is, for example, an N type transistor, with the first terminal coupled to the second terminal of the transistor T1b, a second terminal coupled to a first terminal of the transistor T3b, and a control terminal configured to receive the feedback signal 30a that is generated by the first sampling module 10a. The transistor T3b is, for example, an N type transistor, with the first terminal coupled to the second terminal of the transistor T2b, a second terminal coupled to a first terminal of the transistor T4b, and a control terminal configured to receive the input D. The transistor T4b is, for example, a P type transistor, with the first terminal coupled to the second terminal of the transistor T3b, a second terminal coupled to a $V_{DD}$ terminal, and a control terminal configured to receive the clock A'. A node between the second terminal of the transistor T3b and the first terminal of the transistor T4b outputs the second sampling signal 20b, as illustrated in FIG. 1.

The second sampling module 10b also includes a keeper circuit 14b comprising transistors T5b and T6b that are coupled in series. The transistor T5b is coupled between the first terminal of the transistor T3b and the second terminal of the transistor T3b (i.e., connected parallel to the transistor T3b), and is controlled by an output of an inverter I1b of the second sampling module 10b. The transistor T6b is coupled between the second terminal of the transistor T5b and a power supply terminal (e.g., that is supplying a supply voltage $V_{DD}$), and is controlled by the feedback signal 30a. The second sampling module 10b also includes the inverter I1b, which is configured to receive the second sampling signal 20b and invert the second sampling signal 20b to generate the feedback signal 30b.

In an embodiment, the first sampling circuit 10a and the second sampling circuit 10b are complementary to each other. For example, all the P type transistors and the N type transistors of the first sampling circuit 10a can be respectively replaced by corresponding N type transistors and the P type transistors, thereby achieving the second sampling circuit 10b. For example, the P type transistors T1a, T2a, T3a and T5a of the first sampling circuit 10a correspond respectively to the N type transistors T1b, T2b, T3b and T5b of the second sampling circuit 10b. Similarly, the N type transistors T4a and T6a of the first sampling circuit 10a correspond respectively to the P type transistors T4b and T6b of the second sampling circuit 10b. Furthermore, while the first sampling circuit 10a receives clock B, the second sampling circuit 10b receives an inverted version of clock B (i.e., receives clock A').

The latch 10c includes a series of transistors T10c and T12c. The transistor T10c is, for example, a P type transistor, that is coupled between a supply voltage terminal and the transistor T12c, and is controlled by the second sampling signal 20b. The transistor T12c is, for example, an N type transistor, that is coupled between a ground terminal and the transistor T10c, and is controlled by the first sampling signal 20a. An output node, on which the output Q is received, is coupled between the transistors T10c and T12c.

The latch 10c also includes another series of transistors T14c, T16c, T18c and T20c. The transistor T14c is, for example, a P type transistor, that is coupled between a supply voltage terminal and the transistor T16c, and is controlled by the first sampling signal 20a. The transistor T16c is, for example, a P type transistor, that is coupled between the transistors T14c and T18c, and is controlled by an output of an inverter I1c that is included in the latch 10c. The transistor T18c is, for example, an N type transistor, that is coupled between the transistors T16c and T20c, and is controlled by the output of the inverter I1c. The output node, on which the output Q is received, is also coupled between the transistors T16c and T18c. The transistor T20c is, for example, an N type transistor, and is coupled between the transistor T18c and a ground terminal, and is controlled by the second sampling signal 20b. The inverter I1c receives the output Q and inverts the output Q. An output node of the inverter I1c is labeled as node Qb in FIG. 1.

Figure 2:
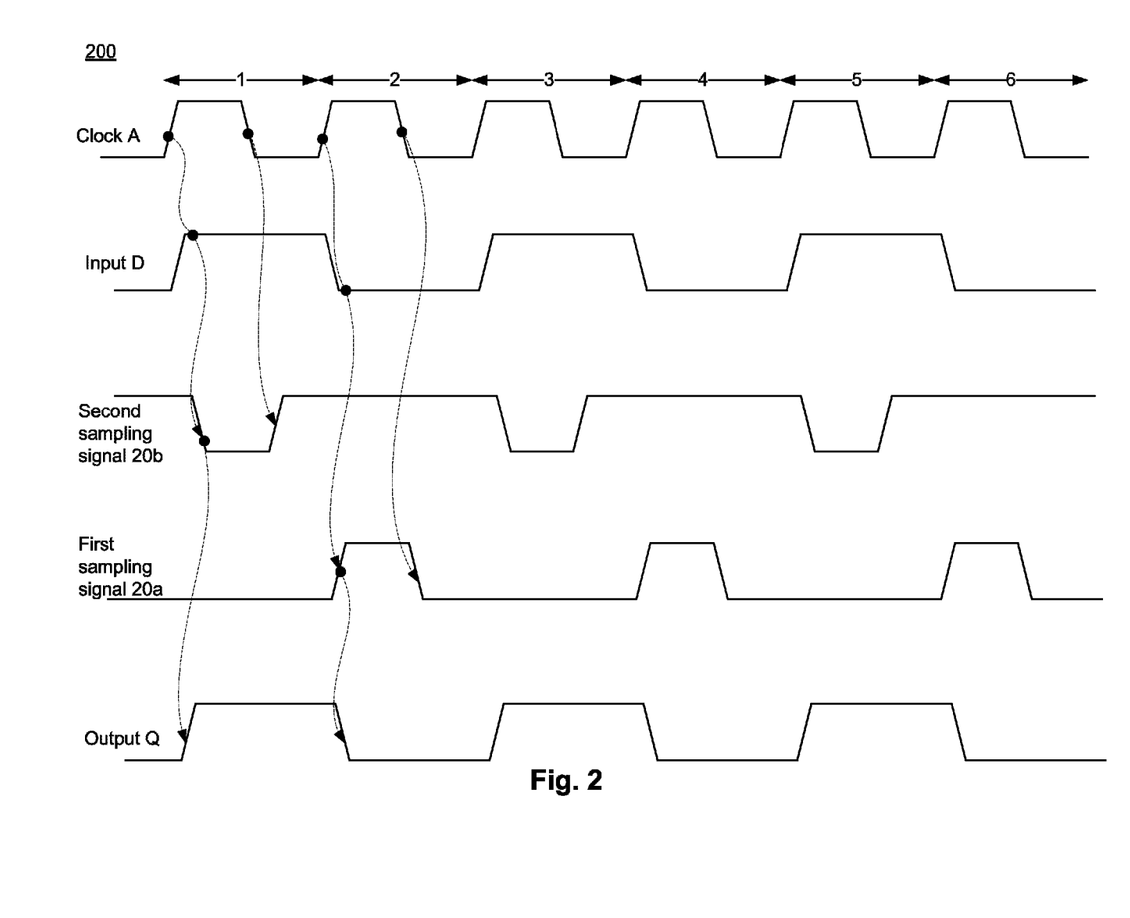
FIG. 2 illustrates a timing diagram of various signals of the flip-flop of FIG. 1, in accordance with an embodiment of the present disclosure.

An operation of the flip-flop 10 is explained with respect to FIG. 2, which illustrates a timing diagram of various signals of the flip-flop 10, in accordance with an embodiment of the present disclosure. For example, FIG. 2 illustrates timing diagram of clock A, input D, the first sampling signal 20a, the second sampling signal 20b and the output Q. Various clock cycles of clock A are labeled in FIG. 2. For example, FIG. 2 illustrates six clock cycles of clock A.

Referring to FIGS. 1 and 2, before the sampling of input D commences (e.g., while input D is low and clock A is low, for example, before the clock cycle 1 of clock A), the first sampling signal 20a and the second sampling signal 20b are pre-charged to a low logical value and a high logical value, respectively. For example, as illustrated in FIG. 2, before the clock cycle 1 of clock A, the first sampling signal 20a and the second sampling signal 20b have low logical value and high logical value, respectively.

During a rising edge of clock A (e.g., a rising edge of the clock cycle 1 of clock A), clock A' also transitions to a high logical value, which turns off the P type transistor T4b and turns on the N type transistor T1b. Furthermore, input D is at a high logical value in the vicinity (e.g., at or almost at the same time) of the rising edge of the clock cycle 1 of clock A, as illustrated in FIG. 2, which turns on the transistor T3b. Also, as the first sampling signal 20a is low during the rising edge of the clock cycle 1 of clock A, the feedback signal 30a is high during the rising edge of the clock cycle 1 of clock A. As a result, transistor T2b is turned on. That is, during the rising edge of the clock cycle 1 of clock A and in response to the logical level of the input D being at the high logical value, transistors T1b, T2b and T3b are turned on and the transistor T4b is turned off. Accordingly, the second sampling signal 20b gets electrically coupled to the ground terminal through transistors T1b, T2b and T3b, and hence, the second sampling signal 20b transitions to a low logical value, as illustrated in FIG. 2.

Also, during the rising edge of the clock cycle 1 of clock A, as the second sampling signal 20b transitions to the low logical value, the feedback signal 30b transitions to a high logical value, which turns off the first sampling circuit 10a (e.g., prevents the first sampling circuit 10a from sampling input D if input D subsequently transitions to the low logical value). For example, during the rising edge of the clock cycle 1 of clock A, as the feedback signal 30b transitions to the high logical value, transistor T2a is turned off. Turning off of the transistor T2a, by the feedback signal 30b, prevents the first sampling signal 20a to transition to the high logical value (e.g., by turning on the transistor T6a) and also aids the first sampling signal 20a to maintain the low logical value, as illustrated in FIG. 2.

Also, during the falling edge of the clock cycle 1 of clock A, the transistor T4b is turned on. Accordingly, the second sampling signal 20b transitions to the high logical value (i.e., enters a pre-charge mode where the second sampling signal 20b gets pre-charged while the clock A is at the low level for the clock cycle 1), as illustrated in FIG. 2.

In an embodiment, the keeper circuits 14a and 14b help maintain the states of the first sampling signal 20a and the second sampling signal 20b, respectively. For example, during the rising edge of the clock cycle 1 of clock A, as the second sampling signal 20b transitions to the low logical value, the feedback signal 30b transitions to the high logical value, which turns on the transistor T6a and grounds the first sampling signal 20a. This helps ensure that the first sampling signal 20a is maintained at the low logical value. Also, as the first sampling signal 20a is maintained at the low logical value, the transistor T5a (which is controlled by an inverse of the first sampling signal 20a) is off, thereby preventing the first sampling signal 20a from transitioning to the high logical value through the keeper circuit 14a.

Also, during the rising edge of the clock cycle 1 of clock A, as the second sampling signal 20b transitions to the low logical value, the transistor T5b (which is controlled by an inverse of the second sampling signal 20b) turns on, thereby aiding in the transition and maintenance of the second sampling signal 20b to the low logical value (e.g., the second sampling signal 20b is coupled to the ground terminal through transistors T5b, T2b and T1b). During this time, the transistor T6b (which is controlled by the inverse of the first sampling signal 20a) is off, thereby preventing the second sampling signal 20b from transitioning to the high logical value through the keeper circuit 14b.

Referring again to FIG. 2, in the vicinity of the rising edge of the clock cycle 2 of clock A, input D is at the low logical value. During the rising edge of the clock cycle 2 of clock A, clock B transitions to the low logical value, which turns off the transistor T4a and turns on the transistor T1a. Furthermore, input D is at the low logical value, which turns on the transistor T3a. Also, as previously discussed, the second sampling signal 20b was already pre-charged to the high logical value while clock A was low preceding the rising edge of the clock cycle 2 of clock A. Accordingly, the feedback signal 30b is low during the rising edge of the clock cycle 2 of clock A. As a result, transistor T2a is turned on. That is, during the rising edge of the clock cycle 2 of clock A, transistors T1a, T2a and T3a are turned on and the transistor T4a is turned off. Accordingly, the first sampling signal 20a transitions to a high logical value (e.g., is electrically coupled to the supply voltage $V_{DD}$ through transistors T1a, T2a and T3a), as illustrated in FIG. 2.

Also, during the rising edge of the clock cycle 2 of clock A, as the first sampling signal 20a transitions to the high logical value, the feedback signal 30a transitions to the low logical value, which turns off the second sampling circuit 10b (e.g., prevents the second sampling circuit 10b from sampling input D if the input D subsequently transitions to the high logical level). For example, during the rising edge of the clock cycle 2 of clock A, as the feedback signal 30a transitions to the low logical value, transistor T2b is turned off and transistor T6b is turned on. Also, as input D is at the low logical value, transistor T3b is also turned off. As transistor T6b is turned on, during and after the rising edge of the clock cycle 2 of clock A, the second sampling signal 20b maintains the high logical value, as illustrated in FIG. 2.

Also, during the falling edge of the clock cycle 2 of clock A, the transistor T4a is turned on and the transistor T1a is turned off. Accordingly, the first sampling signal 20a transitions to the low logical value (i.e., gets pre-charged) by getting coupled to the ground terminal through the transistor T4a, as illustrated in FIG. 2.

Thus, as illustrated in FIG. 2, the first sampling module 10a is configured to, during a rising edge of clock A (e.g., during the rising edge of clock cycle 2 of clock A), sample input D while input D is at the low logical value, and generate the first sampling signal 20a corresponding to input D being sampled by the first sampling module 10a. Similarly, the second sampling module 10b is configured to, during a rising edge of clock A (e.g., during the rising edge of clock cycle 1 of clock A), sample input D while input D is at the high logical value, and generate the second sampling signal 20b corresponding to input D being sampled by the second sampling module 10b. Furthermore, the first sampling module 10a is configured to provide the feedback signal 30a to the second sampling module 10b, wherein, as previously discussed, the feedback signal 30a is operative to prevent the second sampling module 10b from sampling input D if input D has the low logical value. Similarly, the second sampling module 10b is configured to provide the feedback signal 30b to the first sampling module 10a, wherein, as previously discussed, the feedback signal 30b is operative to prevent the first sampling module 10a from sampling input D if input D has the high logical value.

Figure 3:
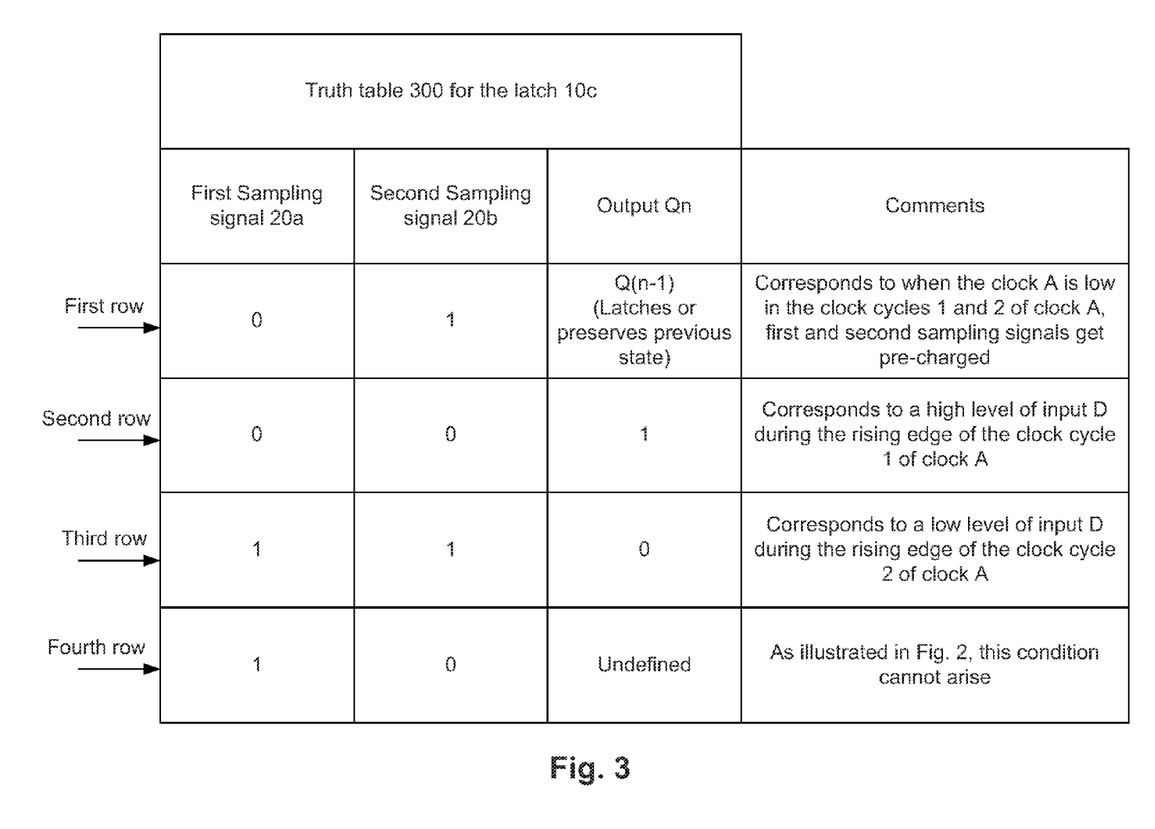
FIG. 3 illustrates a truth table of a latch of the flip-flop of FIG. 1, in accordance with an embodiment of the present disclosure.

As previously discussed, the latch 10c is configured to receive the first sampling signal 20a and the second sampling signal 20b, and to logically generate output Q responsively to the first sampling signal 20a and the second sampling signal 20b. FIG. 3 illustrates a truth table 300 of the latch 10c, in accordance with an embodiment of the present disclosure.

Referring to FIG. 3, the first row of the truth table 300 corresponds to a logical low value of the first sampling signal 20a and a high logical value of the second sampling signal 20b. As illustrated in FIG. 2, this situation arises when clock A is at a low level for the clock cycles 1 and 2, e.g., when the first and second sampling signals are respectively precharged to the low and high logical values. Referring again to FIG. 1, during this situation, the transistor T12c of the latch 10c is turned off by the low logical value of the first sampling signal 20a and the transistor T10c of the latch 10c is also turned off by the high logical value of the second sampling signal 20b. Thus, the output node is neither grounded, nor coupled to the power supply through the transistors T10c and T12c. Furthermore, transistors T14c and T20c are on. Also, under a first scenario, if output Q(n−1) (i.e., the previous state of output Q) was low, then node Qb is at a high logical value, thereby turning on the transistor T18c and turning off the transistor T16c. Thus, if output Q(n−1) was low, then the output node is coupled to the ground terminal through the switched on transistors T18c and T20c, thereby maintaining the low logical value of the output Q (i.e., Qn is equal to Q(n−1)), as illustrated in the timing diagram of FIG. 2 and as also illustrated in the truth table 300. On the other hand, under a second scenario, if output Q(n−1) was high, then node Qb is at a low logical value, thereby turning off the transistor T18c and turning on the transistor T16c. Thus, if output Q(n−1) was high, then the output node is coupled to the power supply terminal through the switched on transistors T14c and T16c, thereby maintaining the logical high value of the output Q (i.e., Qn is equal to Q(n−1)), as illustrated in the timing diagram of FIG. 2 and as also illustrated in the truth table 300.

Referring again to FIG. 3, the second row of the truth table 300 corresponds to logical low values for both the first sampling signal 20a and the second sampling signal 20b. As illustrated in FIG. 2, this situation arises when input D is high in the vicinity of the rising edge of the clock cycle 1 of clock A. When both the first sampling signal 20a and the second sampling signal 20b have logical low values, transistors T12c and T20c are turned off and transistors T10c and T14c are turned on. As both the transistors T12c and T20c are turned off, the output node is not coupled to the ground terminals. On the other hand, as the transistor T10c is turned on, the transistor T10c pulls up the output Q to the high logical value (e.g., by coupling the output node to the power supply terminal), as illustrated in the timing diagram of FIG. 2 and as also illustrated in the truth table 300.

Referring again to FIG. 3, the third row of the truth table 300 corresponds to logical high values for both the first sampling signal 20a and the second sampling signal 20b. As illustrated in FIG. 2, this situation arises when input D is low during the rising edge of the clock cycle 2 of clock A. When both the first sampling signal 20a and the second sampling signal 20b have logical high values, transistors T12c and T20c are turned on, and transistors T10c and T14c are turned off. As both the transistors T10c and T14c are turned off, the output node is not coupled to the power supply terminal. On the other hand, as the transistor T12c is turned on, the transistor T12c pulls down the output Q to a low logical value (e.g., by coupling the output node to the ground terminal), as illustrated in the timing diagram of FIG. 2 and as also illustrated in the truth table 300.

Referring again to FIG. 3, the fourth row of the truth table 300 corresponds to a logical high value of the first sampling signal 20a and a logical low value for the second sampling signal 20b. As illustrated in the timing diagram of FIG. 2, this situation cannot arise in the flip-flop 10 (e.g., no variation in the input D and/or clock A can create this situation). However, if this situation arises for some reason (e.g., through erroneous operation of the first and/or second sampling circuits), the high logical value of the first sampling signal 20a turns on the transistor T12c and the low logical value of the second sampling signal 20b turns on the transistor T10c, thereby shorting the power supply terminal and the ground terminal through the transistors T10c and T12c. Accordingly, the fourth row is marked as undefined in the truth table 300.

Thus, as illustrated in the timing diagram 200 and the truth table 300, in the latch 10c, the output Q switches when the first sampling signal 20a is equal to the second sampling signal 20b (e.g., corresponding to the second and third rows of the truth table 300), and the output Q preserves a previous state (i.e., latches the output) when the first sampling signal 20a and the second sampling signal 20b are at low and high logical values, respectively.

Referring again to the timing diagram 200, output Q takes on the state of input D depending on the value of the input D in the vicinity of a rising edge of clock A, which is similar to the behavior of a D type flip-flop. Thus, the flip-flop 10 is a D-type flip-flop. However, unlike a conventional semi-dynamic D type flip-flop that exhibits a race condition, due to the complementary nature of the first and second sampling circuits of FIG. 1 (e.g., as, by design, the first sampling signal 20a and the second sampling signal 20b are complementary to each other and not competing with each other), such a race condition is absent in the D type flip-flop 10 of FIG. 1.

For example, the first sampling module 10a samples input D when input D is at the low high logical value. Furthermore, the first sampling module 10a provides the feedback signal 30a to the second sampling module 10b, wherein the feedback signal 30a is operative to prevent the second sampling module from sampling input D after input D was sampled with the low logical value. Thus, any race condition between the two sampling modules is absent in the D type flip-flop 10 of FIG. 1. To the contrary, through the feedback signals 30a and 30b, the first and second sampling modules aid each other in sampling input D at right instances (or prevents each other from sampling input D at wrong instances), as previously discussed.

Figure 4:
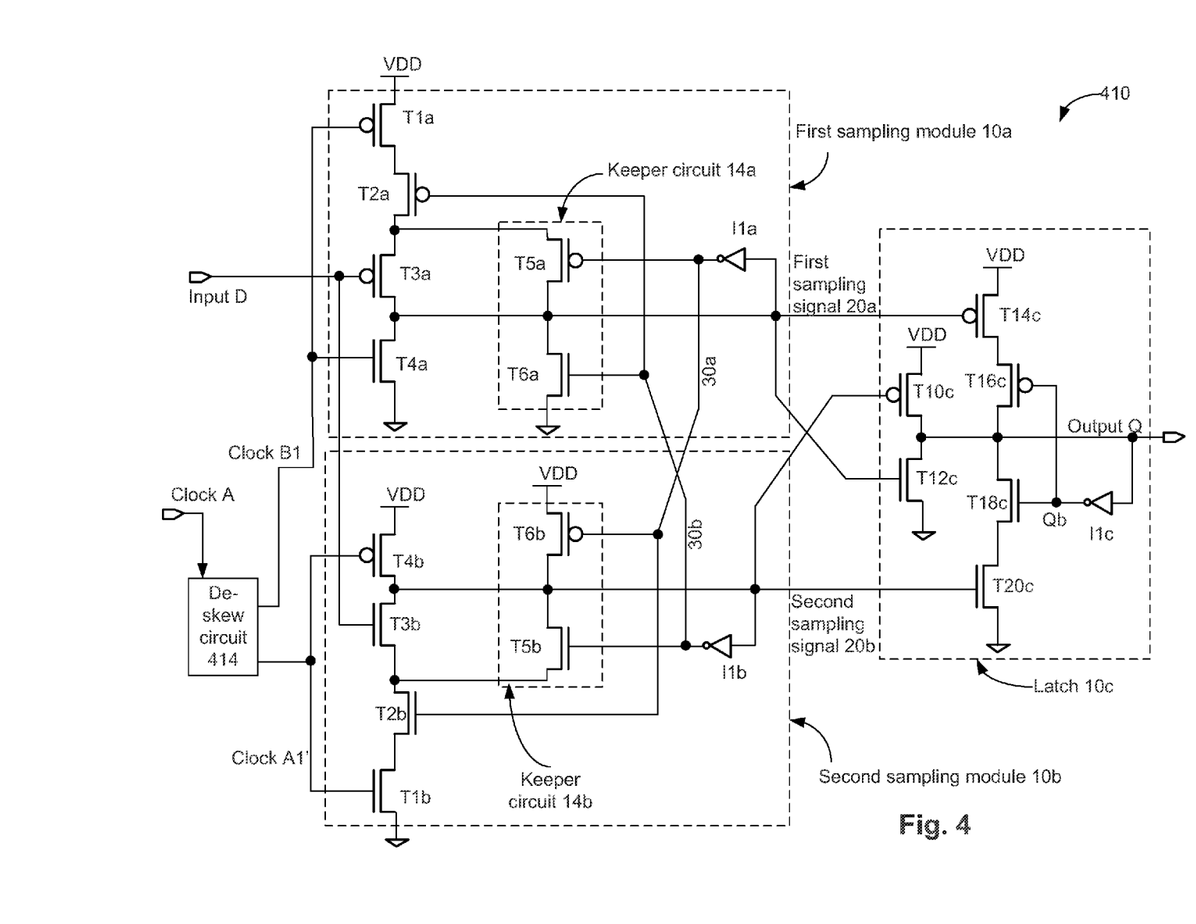
FIG. 4 schematically illustrates a flip-flop that is operated in conjunction with a de-skew circuit, in accordance with an embodiment of the present disclosure.

FIG. 4 schematically illustrates a flip-flop 410 that is operated in conjunction with a de-skew circuit 414, in accordance with an embodiment of the present disclosure. The first sampling circuit 10a, the second sampling circuit 10b and the latch 10c of FIGS. 1 and 4 are substantially similar, and is labeled using same reference labels. However, unlike the flip-flop 10 of FIG. 1, the flip-flop 410 of FIG. 4 does not include any inverter for generating clock B and clock A' (e.g., lacks inverters 11 and 12 of FIG. 1). Instead, the flip-flop 410 includes the de-skew circuit 414, which is configured to receive clock A, and generate clock B1 and clock A1' such that clock B1 is an inverse of clock A, and clock A1' is an inverse of clock B1. In an embodiment, the de-skew circuit 414 reduces (e.g., substantially eliminates) any skew between the various clock signals of the flip-flop 410 of FIG. 4, thereby reducing any clock skew related performance issues in the flip-flop 410.

Figure 5:
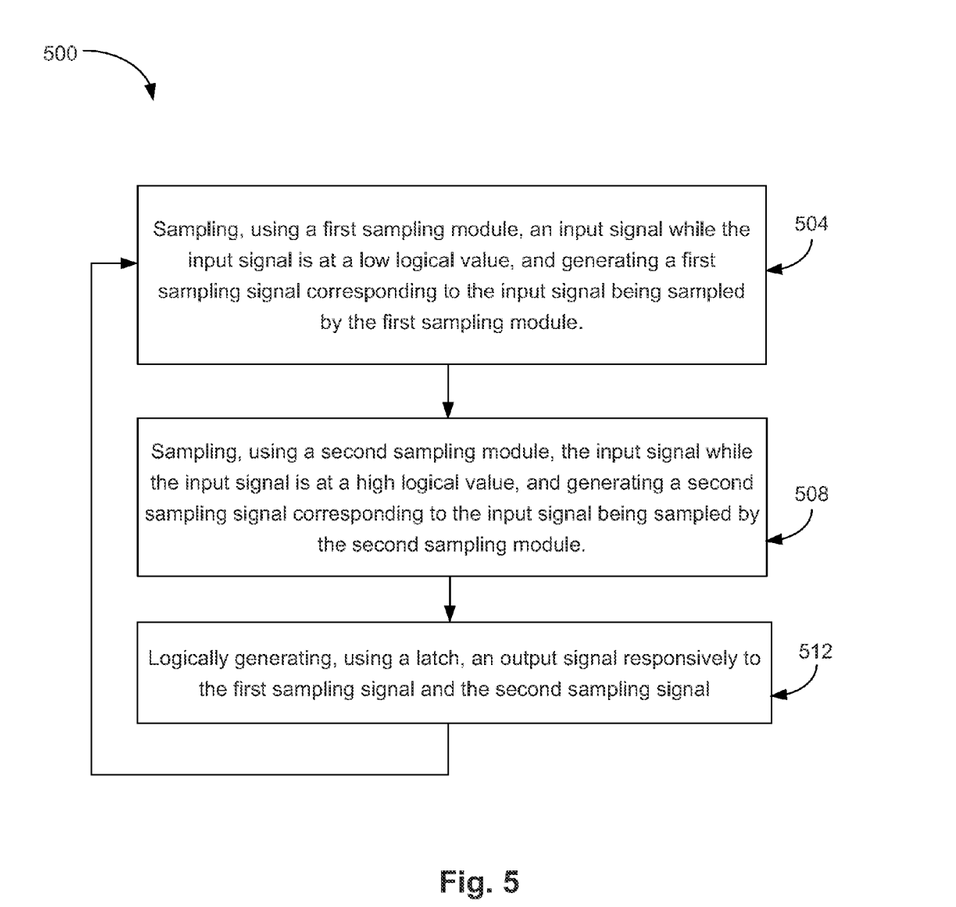
FIG. 5 illustrates an example of a method for operating the flip-flop of FIG. 1 (and/or the flip-flop of FIG. 4), in accordance with an embodiment of the present disclosure.

FIG. 5 illustrates an example of a method 500 for operating the flip-flop 10 of FIG. 1 (and/or the flip-flop 410 of FIG. 4), in accordance with an embodiment of the present disclosure. At 504, the first sampling module 10a samples an input signal (e.g., input D) while the input signal is at a low logical value (e.g., in the vicinity of a rising edge of the clock cycle 2 of clock A, as illustrated in FIG. 2), and generates the first sampling signal 20a corresponding to the input signal being sampled by the first sampling module 10a. At 508, the second sampling module 10b samples the input signal while the input signal is at a high logical value (e.g., in the vicinity of a rising edge of the clock cycle 1 of clock A, as illustrated in FIG. 2), and generates the second sampling signal 20b corresponding to the input signal being sampled by the second sampling module 10b. At 512, the latch 10c logically generates an output signal (e.g., output Q) responsively to the first sampling signal 20a and the second sampling signal 20b. The method repeats in a continuous loop. Although various operations of the method 500 are illustrated to occur in a sequential manner, this may not necessarily be the case. For example, a generation of the output signal at 512 occurs while and/or after each of the sampling operations of 504 and 508.

The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although specific embodiments have been illustrated and described herein, it is noted that a wide variety of alternate and/or equivalent implementations may be substituted for the specific embodiment shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. A D type flip-flop, comprising:
a first sampling module configured to sample an input signal while the input signal is at a low logical value;
a second sampling module configured to (i) sample the input signal while the input signal is at a high logical value and (ii) refrain from sampling the input signal when the input signal is sampled at the low logical value by the first sampling module, wherein the first sampling module is further configured to provide a first feedback signal to the second sampling module, wherein the first feedback signal is operative to prevent the second sampling module from sampling the input signal if the input signal was sampled with the low logical value;
a latch configured to logically generate an output signal responsively to the sampling of the input signal by the first sampling module and by the second sampling module.

2. An integrated circuit comprising the D type flip flop of claim 1.

3. The D-type flip-flop of claim 1, wherein:
the first sampling module is further configured to refrain from sampling the input signal if the input signal was sampled at the high logical value by the second sampling module.

4. A D type flip-flop, comprising:
a first sampling module configured to sample an input signal while the input signal is at a low logical value;
a second sampling module configured to (i) sample the input signal while the input signal is at a high logical value and (ii) refrain from sampling the input signal when the input signal is sampled at the low logical value by the first sampling module, wherein the second sampling module is further configured to provide a second feedback signal to the first sampling module, wherein the second feedback signal is operative to prevent the first sampling module from sampling the input signal if the input signal was sampled with the high logical value; and
a latch configured to logically generate an output signal responsively to the sampling of the input signal by the first sampling module and by the second sampling module.

5. A D type flip-flop, comprising:
a first sampling module configured to sample an input signal while the input signal is at a low logical value, wherein the first sampling module is further configured to generate a first sampling signal corresponding to the input signal being sampled by the first sampling module, wherein the first sampling module is further configured to (i) pre-discharge the first sampling signal to a low logical value during a low level of a clock signal, and (ii) selectively charge the first sampling signal to a high logical value during a high level of the clock signal based on the input signal being sampled at the low logical value;
a second sampling module configured to (i) sample the input signal while the input signal is at a high logical value and (ii) refrain from sampling the input signal when the input signal is sampled at the low logical value by the first sampling module, wherein the second sampling module is further configured to generate a second sampling signal corresponding to the input signal being sampled by the second sampling module; and
a latch configured to logically generate an output signal responsively to the sampling of the input signal by the first sampling module and by the second sampling module.

6. The D type flip-flop of claim 5, wherein the first sampling module is further configured to sample the input signal, while the input signal is at the low logical value, by said selectively charging the first sampling signal.

7. A D type flip-flop, comprising:
a first sampling module configured to sample an input signal while the input signal is at a low logical value, wherein the first sampling module is further configured to generate a first sampling signal corresponding to the input signal being sampled by the first sampling module;

a second sampling module configured to (i) sample the input signal while the input signal is at a high logical value and (ii) refrain from sampling the input signal when the input signal is sampled at the low logical value by the first sampling module, wherein the second sampling module is further configured to generate a second sampling signal corresponding to the input signal being sampled by the second sampling module, wherein the second sampling module is further configured to (i) pre-charge the second sampling signal to a high logical value during a low level of a clock signal, and (ii) selectively discharge the second sampling signal to a low logical value during a high level of the clock signal based on the input signal being sampled at the high logical value; and a latch configured to logically generate an output signal responsively to the sampling of the input signal by the first sampling module and by the second sampling module.

8. The D type flip-flop of claim 7, wherein the second sampling module is further configured to sample the input signal, while the input signal is at the high logical value, by said selectively dis-charging the second sampling signal.

9. The D type flip-flop of claim 7, wherein the first sampling module is further configured to:
dis-charge the first sampling signal to a low logical value during a low level of a clock signal; and
selectively charge the second sampling signal to a high logical value during a high level of the clock signal based on the input signal being sampled at the low logical value.

10. The D type flip-flop of claim 7, wherein the latch is configured to:
switch the output signal when the first and second sampling signals have identical logical values; and
preserve a previous state of the output signal when the first sampling signal has a low logical value and the second sampling signal has a high logical value.

11. The D type flip-flop of claim 7, wherein the latch is configured to:
have an undefined state of the output signal when the first sampling signal has a high logical value and the second sampling signal has a low logical value.

12. The D type flip-flop of claim 7, wherein the second sampling module comprises:
a first series of transistors that include:
a first transistor coupled between a power supply terminal and a second transistor, wherein the first transistor is configured to be controlled by a clock signal;
the second transistor coupled between the first transistor and a third transistor, wherein the second transistor is configured to be controlled by the input signal;
the third transistor coupled between the second transistor and a fourth transistor, wherein the third transistor is configured to be controlled by a first feedback signal generated by the first sampling circuit, wherein the first feedback signal is an inverse of the first sampling signal; and
the fourth transistor coupled between the third transistor and a ground terminal, wherein the fourth transistor is configured to be controlled by the clock signal.

13. The D type flip-flop of claim 12, wherein the second sampling module further comprises:
a keeper circuit configured to maintain the second sampling signal, the keeper circuit comprising:
a fifth transistor coupled between (i) a node that is between the second and third transistors, and (ii) a sixth transistor, wherein the fifth transistor is configured to be controlled by a second feedback signal; and
the sixth transistor coupled between the fifth transistor and a power supply terminal, the sixth transistor configured to be controlled by the first feedback signal.

14. The D type flip-flop of claim 13, wherein the second sampling module further comprises:
an inverter configured to receive the second sampling signal and generate the second feedback signal.

15. A D type flip-flop, comprising:
a first sampling module configured to sample an input signal while the input signal is at a low logical value, wherein the first sampling module is further configured to generate a first sampling signal corresponding to the input signal being sampled by the first sampling module;
a second sampling module configured to (i) sample the input signal while the input signal is at a high logical value and (ii) refrain from sampling the input signal when the input signal is sampled at the low logical value by the first sampling module, wherein the second sampling module is further configured to generate a second sampling signal corresponding to the input signal being sampled by the second sampling module; and
a latch configured to logically generate an output signal responsively to the sampling of the input signal by the first sampling module and by the second sampling module,
wherein the first sampling module comprises a first series of transistors that include:
a first transistor coupled between a power supply terminal and a second transistor, wherein the first transistor is configured to be controlled by an inverse of a clock signal;
the second transistor coupled between the first transistor and a third transistor, wherein the second transistor is configured to be controlled by a first feedback signal generated by the second sampling circuit, wherein the first feedback signal is an inverse of the second sampling signal;
the third transistor coupled between the second transistor and a fourth transistor, wherein the third transistor is configured to be controlled by the input signal; and
the fourth transistor coupled between the third transistor and a ground terminal, wherein the fourth transistor is configured to be controlled by the inverse of the clock signal.

16. The D type flip-flop of claim 15, wherein the first sampling module further comprises:
a keeper circuit configured to maintain the first sampling signal, the keeper circuit comprising:
a fifth transistor coupled between (i) a node that is between the second and third transistors, and (ii) a sixth transistor, wherein the fifth transistor is configured to be controlled by a second feedback signal; and
the sixth transistor coupled between the fifth transistor and a ground terminal, the sixth transistor configured to be controlled by the first feedback signal.

17. The D type flip-flop of claim 16, wherein the first sampling module further comprises:
an inverter configured to receive the first sampling signal and generate the second feedback signal.

18. A method comprising:
sampling, using a first sampling module, an input signal while the input signal is at a low logical value;
sampling, using a second sampling module, the input signal while the input signal is at a high logical value;

logically generating, using a latch, an output signal responsively to the first sampling signal and the second sampling signal;

providing, by the first sampling module, a first feedback signal to the second sampling module; and preventing, using the first feedback signal, the second sampling module from sampling the input signal if the low logical value is sampled on the input signal.

19. The method of claim 18, further comprising:

providing, by the second sampling module, a second feedback signal to the first sampling module; and preventing, by the second feedback signal, the first sampling module from sampling the input signal if the high logical value is sampled on the input signal.

20. A flip-flop latch comprising:

a latch configured to:

receive a first input signal and a second input signal, and logically generate an output signal;

switch the output signal when the first and second input signals have substantially identical logical values;

preserve a previous state of the output signal when the first input signal has a low logical value and the second input signal has a high logical value; and have an undefined state of the output signal when the first sampling signal has a high logical value and the second sampling signal has a low logical value.

21. The flip-flop of claim 20, wherein the latch is further configured to:

switch the output signal to a high logical value when the first and second input signals have low logical values; and switch the output signal to a low logical value when the first and second input signals have high logical values.

22. The flip-flop of claim 20, wherein the flip-flop is a D type flip-flop.

23. The flip-flop of claim 20, wherein the latch is further configured to:

receive the first input signal from a first sampling module of the D type flip-flop, wherein the first sampling module is configured to (i) sample a third input signal while the third input signal is at a low logical value, and (ii) generate the first input signal corresponding to the third input signal being sampled by the first sampling module; and receive the second input signal from a second sampling module of the D type flip-flop, wherein the second sampling module is configured to (i) sample the third input signal while the third input signal is at a high logical value, and (ii) generate the second input signal corresponding to the third input signal being sampled by the second sampling module.

24. The flip-flop of claim 20, wherein the latch comprises:

a first series of transistors comprising:

a first transistor coupled between a power supply terminal and a second transistor, wherein the first transistor is configured to be controlled by the second input signal; and a second transistor coupled between a ground terminal and the first transistor, wherein the second transistor is configured to be controlled by the first input signal, wherein an output node, which outputs the output signal, is coupled between the first and second transistors.

25. The flip-flop of claim 24, wherein the latch further comprises:

a second series of transistors comprising:

a third transistor coupled between a power supply terminal and a fourth transistor, wherein the third transistor is configured to be controlled by the first input signal;

the fourth transistor coupled between the third transistor and a fifth transistor, wherein the fourth transistor is configured to be controlled by an inverse of the output signal;

the fifth transistor coupled between the fourth transistor and a sixth transistor, wherein the fifth transistor is configured to be controlled by the inverse of the output signal; and the sixth transistor coupled between the fifth transistor and a ground terminal, wherein the sixth transistor is configured to be controlled by the second input signal, wherein the output node is coupled between the fourth and fifth transistors.

\* \* \* \* \*